United States Patent
Schmitt et al.

(10) Patent No.: US 10,670,663 B2
(45) Date of Patent: Jun. 2, 2020

(54) WARNING METHOD FOR A HIGH-VOLTAGE BATTERY OF A MOTOR VEHICLE IN THE CASE OF AN ACCIDENT OF THE MOTOR VEHICLE, A WARNING SYSTEM FOR CARRYING OUT THE WARNING METHOD, AND A MOTOR VEHICLE THAT COMPRISES COMPONENTS OF THE WARNING SYSTEM

(71) Applicant: AUDI AG, Ingolstadt (DE)

(72) Inventors: Nicholas Schmitt, Ingolstadt (DE); Maik Hofmann, Gaimersheim (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 16/178,831

(22) Filed: Nov. 2, 2018

(65) Prior Publication Data
US 2019/0135126 A1 May 9, 2019

(30) Foreign Application Priority Data
Nov. 9, 2017 (DE) .................. 10 2017 219 990

(51) Int. Cl.
*G01R 31/371* (2019.01)
*B60L 58/10* (2019.01)
(Continued)

(52) U.S. Cl.
CPC .......... *G01R 31/371* (2019.01); *B60L 3/0046* (2013.01); *B60L 58/10* (2019.02);
(Continued)

(58) Field of Classification Search
CPC ..... G01R 31/371; B60L 58/10; B60L 3/0046; B60L 2250/10; B60L 2250/16; G07C 5/008; G08B 25/016; H01M 10/48
(Continued)

(56) References Cited

U.S. PATENT DOCUMENTS

2011/0031047 A1  2/2011  Tarr
2011/0246259 A1*  10/2011  Hostyn ................. B60L 53/305
                                                 705/7.31
(Continued)

FOREIGN PATENT DOCUMENTS

CN   106143185 A   11/2016
DE      2351185 A1    5/1975
(Continued)

OTHER PUBLICATIONS

Wolfe et al., Improving Rescue Information Using C2C and C2I Communication, 2013 (Year: 2013).*
(Continued)

*Primary Examiner* — Omar Casillashernandez
(74) *Attorney, Agent, or Firm* — Maier & Maier, PLLC

(57) ABSTRACT

A warning method for a high-voltage battery of a motor vehicle, with which, in the case of an accident of the motor vehicle, emergency responders can be provided details on the state of the high-voltage battery of the motor vehicle after the accident. This warning method includes at least one state diagnosis relating to at least one component of the high-voltage battery is created on the basis of supplied sensor data by means of an analysis unit, as soon as the accident of the motor vehicle has been detected. In addition, a total state diagnosis of the high-voltage battery based on this at least one state diagnosis is created. The at least one state diagnosis is transmitted via a corresponding communications unit to a vehicle-external monitoring unit, and the total state diagnosis of the high-voltage battery is transmitted via this communications unit to an emergency call dispatcher.

8 Claims, 1 Drawing Sheet

(51) Int. Cl.
*G08B 25/08* (2006.01)
*B60L 3/00* (2019.01)
*G07C 5/00* (2006.01)
*G08B 25/01* (2006.01)
*H01M 10/48* (2006.01)

(52) U.S. Cl.
CPC .......... *G07C 5/008* (2013.01); *G08B 25/016* (2013.01); *G08B 25/08* (2013.01); *H01M 10/48* (2013.01); *B60L 2250/10* (2013.01); *B60L 2250/16* (2013.01)

(58) Field of Classification Search
USPC ...................................................... 340/636.1
See application file for complete search history.

(56) References Cited

U.S. PATENT DOCUMENTS

| | | | |
|---|---|---|---|
| 2012/0050067 | A1 | 3/2012 | Otterson |
| 2012/0150464 | A1 | 6/2012 | Swanton |
| 2017/0124788 | A1* | 5/2017 | Nishida ............... G07C 5/0833 |
| 2018/0270640 | A1* | 9/2018 | Iwata ...................... H04W 4/90 |
| 2019/0084425 | A1* | 3/2019 | Liu ....................... B60L 3/0092 |

FOREIGN PATENT DOCUMENTS

| | | |
|---|---|---|
| DE | 4115568 A1 | 2/1993 |
| DE | 19824290 A1 | 12/1999 |
| DE | 102012102664 A1 | 10/2013 |
| DE | 102012015525 A1 | 2/2014 |
| DE | 102013216129 A1 | 2/2015 |
| DE | 202015004176 U1 | 7/2015 |
| DE | 102015015666 A1 | 8/2016 |
| EP | 2344357 B1 | 11/2014 |

OTHER PUBLICATIONS

German Search Report dated Sep. 13, 2018 of corresponding application No. DE102017219990.3; 12 pgs.

Wolf, A.H. et al., "Improving Rescue Information Using C2C and C2I Communication", 2013 IEEE 5th International Symposium on Wireless Vehicular Communications (WiVeC), Year: 2013, pp. 1-5, URL: https://ieeexplore.ieee.org/stamp/stam p.jsp?tp=&arnumber=6698236, Searched: Sep. 13, 2018, 6 pgs.

* cited by examiner

WARNING METHOD FOR A HIGH-VOLTAGE BATTERY OF A MOTOR VEHICLE IN THE CASE OF AN ACCIDENT OF THE MOTOR VEHICLE, A WARNING SYSTEM FOR CARRYING OUT THE WARNING METHOD, AND A MOTOR VEHICLE THAT COMPRISES COMPONENTS OF THE WARNING SYSTEM

FIELD

The invention relates to a warning method for a high-voltage battery of a motor vehicle in the case of an accident of the motor vehicle, a warning system for carrying out a warning method of this kind, and a motor vehicle that comprises components external to the vehicle of a warning system of this kind.

BACKGROUND

If an accident involving a motor vehicle with a high-voltage battery occurs, the state of the high-voltage battery of the motor vehicle is initially not evident to the emergency responders on site. For protecting and for assisting the emergency responders, various warning devices integrated into motor vehicles already exist that make available information on the basis of which the emergency responders can assess the extent of a potential danger ensuing from the high-voltage battery.

Described in DE 10 2012 102 664 A, for example, is a warning device for determining and indicating a potentially dangerous state of a high-voltage battery system, by way of which emergency responders are informed of the state of the high-voltage battery with the aid of an optical or acoustic alarm signal at the motor vehicle.

Provided in DE 10 2015 015 666 A1, in addition, is a warning device for warning against an electrical potential supplied by a high-voltage battery and applied to the bodywork of a motor vehicle, with the aid of an optical and/or acoustic alarm signal.

Known from DE 10 2013 216 129 A1, moreover, is a high-voltage device, which has at least one current sensor and one transmission device and communicates via a wireless radio connection to a smartphone or a tablet PC of emergency responders as to whether or not a potential danger ensues from the high-voltage component. For this purpose, a depiction of the motor vehicle is displayed on the smartphone or tablet PC of the emergency responders, and, by use of a two-color traffic light, indicates at the positions of the at least one current sensor whether or not a danger ensues from the elements of the high-voltage battery there. It is thus provided that information is made available to emergency responders on site about the danger potential of individual components of the high-voltage battery. For this purpose, however, special hardware and software are needed, that is, a smartphone or corresponding tablet PC, which is equipped for this purpose and which the emergency responders must carry with them to the accident site.

SUMMARY

The object of the invention is to make available a method, by means of which, with little effort, emergency responders are provided details about the state of a high-voltage battery after an accident.

In accordance with the invention, this object is achieved by a warning method for a high-voltage battery of a motor vehicle in the case of an accident of the motor vehicle, said method comprising the following steps: creation of at least one diagnosis or state relating to at least one component of the high-voltage battery on the basis of supplied sensor data by means of an analysis unit as soon as an accident of the motor vehicle has been detected; creation of a total state diagnosis of the high-voltage battery on the basis of the at least one state diagnosis, which is either dangerous or not dangerous; transmission of the at least one state diagnosis via a communications unit to a monitoring unit external to the vehicle; and transmission of the total state diagnosis of the high-voltage battery to an emergency call dispatcher via the communications unit.

Accordingly, what is involved in the method proposed in accordance with the invention is a method with which information is provided about a potentially dangerous state of the high-voltage battery of a motor vehicle in the case that this motor vehicle has been involved in an accident. This method provides that, first of all, the status of various individual components of the high-voltage battery is assessed. This assessment occurs by an analysis unit and is based on data that have been supplied to the analysis unit and contain information about the state of the individual components of the high-voltage battery. In this way, a so-called state diagnosis is determined for each individual component of the high-voltage battery for which corresponding data are available. That is, an assessment is made as to what extent the particular component is OK, that is, still functional, or whether it has a defect and consequently is no longer OK. The determination of the state diagnoses always occurs when the motor vehicle has been in an accident. That an accident has taken place can be established, for example, in that the airbags of the motor vehicle have been triggered.

In addition to the state diagnoses, the total state diagnosis of the high-voltage battery is created and involves a combination of all individual state diagnoses. The total state diagnosis is thus determined by checking whether all individual state diagnoses are "component OK." If this is the case, the total state diagnosis is "not dangerous." If individual state diagnoses indicate defects in the high-voltage battery, the total state diagnosis is "dangerous." Therefore, on the basis of the total state diagnosis of the high-voltage battery, a distinction is made between the two system states "dangerous" and "not dangerous."

The total state diagnosis is subsequently transmitted via a corresponding communication interface with the aid of a corresponding radio-frequency link to an emergency call dispatcher, that is, to a dispatcher, who, depending on the kind of reported emergency call, alerts corresponding emergency services, such as, for example, police or firefighters. This transmission of the total state diagnosis preferably occurs through an eCall connection, that is, together with the report of the accident to the corresponding local emergency call dispatcher.

The individual state diagnoses are likewise transmitted via a communication interface by use of a corresponding radio-frequency link, such as, for example, by use of an LTE-V link, to a monitoring unit external to the vehicle. This vehicle-external monitoring unit preferably involves a server, such as, for example, a server of a data-processing center that can be accessed worldwide and is either made available by the vehicle manufacturer itself or is run by an operator.

Therefore, the warning method according to the invention differentiates between two different signals that contain information on the state of the high-voltage battery. On the one hand, the individual components of the high-voltage battery are examined individually in regard to their state, with state diagnoses of these components being determined, and, on the other hand, a total state diagnosis of the high-voltage battery occurs. These two different sets of data are transmitted to different external units, namely, the state diagnoses to a monitoring unit provided for this purpose and the total state diagnosis to an emergency call dispatcher, this preferably occurring by use of an eCall connection.

In another advantageous embodiment of the invention, it is provided that the vehicle-external monitoring unit of the emergency call dispatcher makes available the at least one state diagnosis. Accordingly, the vehicle-external monitoring unit makes available the state diagnoses for retrieval by the emergency call dispatcher. Consequently, the emergency call dispatcher can also receive transmission of the individual state diagnoses of the individual components in addition to the total state diagnosis of the high-voltage battery of the motor vehicle. However, the transmission of the state diagnoses needs to be requested by the emergency call dispatcher. Depending on the settings and desires of the emergency call dispatcher, a retrieval of the state diagnoses can always occur, that is, can occur automatically, or, for example, can occur only when the total state diagnosis is "dangerous." It is also possible that, initially, no state diagnoses are retrieved by the emergency call dispatcher, but instead it is decided only on site by the emergency responders whether they desire a transmission of the individual state diagnoses. Accordingly, the transmission of the state diagnoses to the emergency responders is possible automatically or manually. Through an additional transmission of the state diagnoses, the emergency responders have at hand comprehensive details on the state of individual components of the high-voltage battery, as a result of which, an especially safe recovery of a motor vehicle that has a high-voltage battery and is involved in an accident is possible.

In another advantageous embodiment of the invention, it is provided that the total state diagnosis is transmitted to an optical and/or acoustic signal unit of the motor vehicle and is indicated by it. The information as to whether or not a danger ensues from the high-voltage battery is therefore indicated directly at the motor vehicle by a visual and/or audible warning sign. The signal unit provided for this purpose can be, for example, an LED lamp or a speaker, which emits a corresponding alarm sound. This makes it possible for emergency responders to recognize directly on site, on the basis of a flashing light in the region of the windshield, for example, whether the high-voltage battery is in a potentially dangerous state. This can be indicated, for example, by a flashing red light or, in the case of a high-voltage battery that poses no danger, by a flashing green light.

In addition, an optical or acoustic warning signal that is perceptible on site has the advantage that, in the case that the state of the high-voltage battery changes owing to leaking of cooling water, for example, when the emergency responders are present, the corresponding signal can switch from "not dangerous" to "dangerous," that is, for example, from green to solid red light or from green to flashing red light. Accordingly, a sudden danger ensuing from the high-voltage battery would be indicated directly to the emergency responders, so that they can respond in a targeted manner and as immediately as possible to it by retrieval of corresponding state diagnosis data from the monitoring unit external to the vehicle, for example. Instead of a light signal in the region of the windshield, corresponding LEDs that can be readily seen from the outside can also be placed at other positions in the motor vehicle.

Another advantageous embodiment of the invention provides that the at least one determined state diagnosis indicates at least whether the component is defective or not defective. Accordingly, the assessment of the status of an individual component of the high-voltage battery can be "OK" or "not OK." The determination of the state diagnoses is based on checking whether the corresponding sensor values of the component lie in a certain desired range. Alternatively, it is thereby also possible to choose gradations. For example, a scale of 1 to 10 or another multistep scale could be used as the basis for the assessment. Thus, for example, a small increase in temperature in a component of the high-voltage battery, which does not result in an acute danger for the emergency responders on site, may merely bring about an assessment of the state of this component as having a danger potential in one of steps 1 to 3. In the case of a strong increase in temperature in the corresponding component, however, a higher assessment of the danger potential would occur, such as, for example, a danger potential in one of steps 8 to 10. Accordingly, it is possible not only to distinguish between two state diagnoses, but also between any arbitrary number thereof. This makes possible a more precise and, in addition, more readily comprehensible, assessment of the status of the individual components of the high-voltage battery.

In another advantageous embodiment of the invention, it is provided that the sensor data and the total state diagnosis are transmitted to the monitoring unit external to the vehicle. Therefore, not only are the state diagnoses transmitted to the monitoring unit, but also the raw data itself, as well as the analysis of the state diagnoses in the form of the total state diagnosis are transmitted. This makes possible a more precise evaluation of the danger potential by way of corresponding analysis programs, so that an additional estimation of the situation of the high-voltage battery after the accident is possible. Alternatively, the assessment of the situation can be made by experts of the monitoring unit.

Another advantageous embodiment of the invention provides that the sensor data are determined by at least one corresponding sensor device of the motor vehicle and/or of the high-voltage battery and are transmitted to the analysis unit. Accordingly, in the region of the high-voltage battery, there are different sensors, such as, for example, temperature probes, moisture sensors, current sensors, or the like, which, via a bus communication, initially determine corresponding data relating to the high-voltage battery and subsequently transmit said data to the analysis unit. This makes it possible for individual components of the high-voltage battery to be monitored in regard to various measured values. Accordingly, it is possible to monitor as many potentially dangerous components of the high-voltage battery as possible.

Further provided in accordance with the invention is a warning system with which the described warning method can be carried out. For this purpose, such a warning system has the corresponding components, that is, as components external to the vehicle, at least one analysis unit, a communications unit, at least one sensor unit that monitors corresponding components of the high-voltage battery, and a signal device for optical and/or acoustic warning signals. External to the vehicle, the warning system has at least one vehicle-external monitoring unit as well as an emergency call dispatcher. The individual components of this warning system are designed to carry out the above-described steps of the warning method for a high-voltage battery of a motor vehicle in the case of an accident of the motor vehicle.

In another advantageous embodiment of the warning system, it is provided that vehicle-external components of the warning system are designed to be supplied with electrical energy from a power supply source that is independent of the high-voltage battery. Accordingly, the warning system can carry out the described warning method autarchically, that is, independently of the state of the high-voltage battery. The energy supply of the warning system can be provided, for example, through an emergency energy supply of the motor vehicle, which is also provided for the supply of other components of the motor vehicle in the case of a failure of the high-voltage battery. If, during the accident, the high-voltage battery has been damaged, so that it is no longer functional, the warning system can nonetheless remain active and the particular information can be transmitted to the corresponding units, the vehicle-external monitoring unit and the emergency call dispatcher.

In another advantageous embodiment of the invention, it is provided that the warning system itself has an energy supply that is designed to supply vehicle-external components of the warning system with electrical energy independently of the high-voltage battery. It is therefore provided that the warning system itself has its own power supply, such as, for example, its own battery, which is provided only for supplying the warning system or the vehicle-external components of the warning system. This likewise makes it possible for the warning system to remain fully functional even in the case of a defect in the high-voltage battery after an accident.

Further provided in accordance with the invention is a motor vehicle, which comprises an analysis unit that, on the basis of supplied sensor data, is designed to create at least one state diagnosis relating to at least one component of the high-voltage battery as soon as an accident of the motor vehicle has been detected and, on the basis of the at least one state diagnosis, to create a total state diagnosis of the high-voltage battery that is "dangerous" or "not dangerous." In addition, the motor vehicle has a communications unit that is designed to transmit the at least one state diagnosis to a monitoring unit external to the vehicle and the total state diagnosis of the high-voltage battery to an emergency call dispatcher. Accordingly, the motor vehicle proposed in accordance with the invention comprises at least the two units external to the vehicle that are necessary for the purpose of carrying out the described warning method for a high-voltage battery of a motor vehicle in the case of an accident of the motor vehicle.

The invention also comprises the combinations of the described embodiments.

The invention also includes enhancements of the method according to the invention that have features such as those already described in connection with the enhancements of the motor vehicle according to the invention. For this reason, the corresponding enhancements of the method according to the invention are not described once again here.

BRIEF DESCRIPTION OF DRAWINGS

Described below is an exemplary embodiment of the invention. Shown for this purpose are.

DETAILED DESCRIPTION

In the exemplary embodiment explained below, what is involved is a preferred embodiment of the invention. In the exemplary embodiment, the described components of the embodiment each represent individual features, which are to be regarded as independent of one another and each of which further develops the invention also independently of one another and, accordingly, which are also to be regarded individually or in a combination different from that shown as being a part of the invention. Furthermore, the described embodiment can also be supplemented by features additional to those already described.

In the figures, functionally identical elements are each furnished with the same reference numbers.

Figure 1:
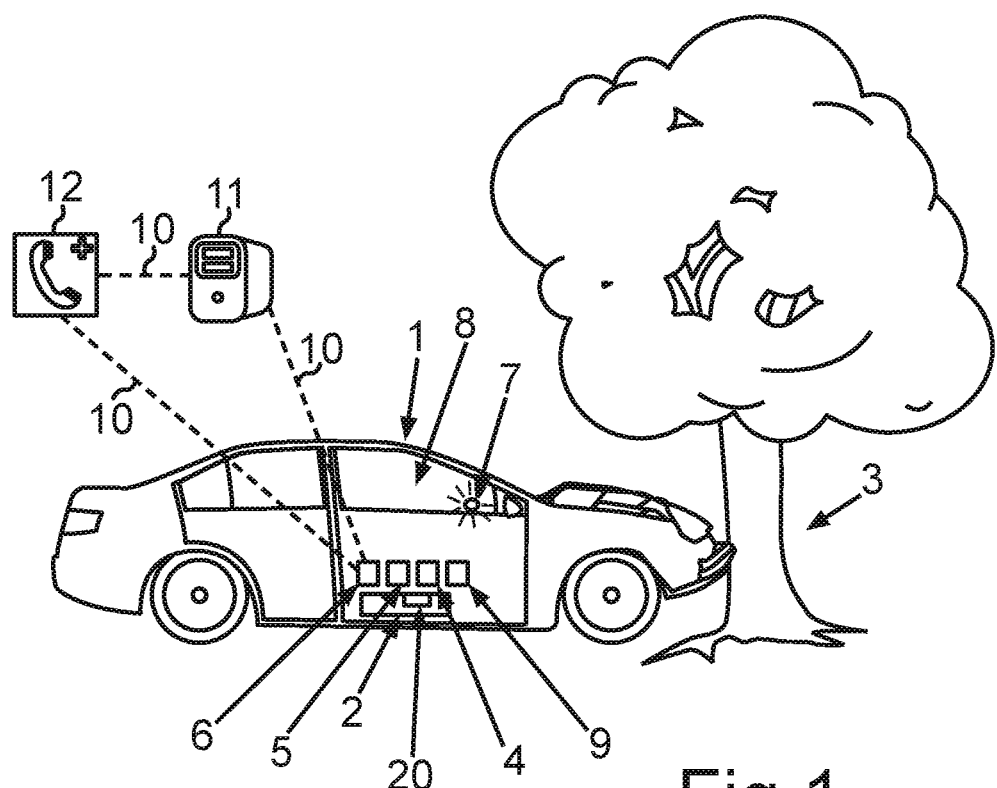
FIG. 1 a schematic illustration of a motor vehicle that is furnished with a high-voltage battery and has had an accident, and, with the aid of a warning method, emits data on a state of the high-voltage battery of the motor vehicle.

Schematically drawn in FIG. 1 is a motor vehicle 1 having a high-voltage battery 2 that has had an accident by being driven into a tree 3. The motor vehicle 1 has a sensor unit 4, an analysis unit 5, a communications unit 6, a power supply 9, and the high-voltage battery 2 with a component 20. After it has been established that the motor vehicle 1 has been involved in an accident, this being established, for example, in that the airbags of the motor vehicle 1 have been triggered, a warning system 30 (see for this FIG. 2, in which the warning system 30 is shown in detail) of the high-voltage battery 2 of the motor vehicle 1 is activated.

Additional components of the warning system of the high-voltage battery are a signal device 7 in a window 8 of the motor vehicle 1 as well as a vehicle-external monitoring unit 11 and an emergency call dispatcher 12. The communications unit 6 builds up a communication link 10 to these two units external to the vehicle, with it also being possible for a communication link 10 to be present between the vehicle-external monitoring unit 11 and the emergency call dispatcher 12.

Figure 2:
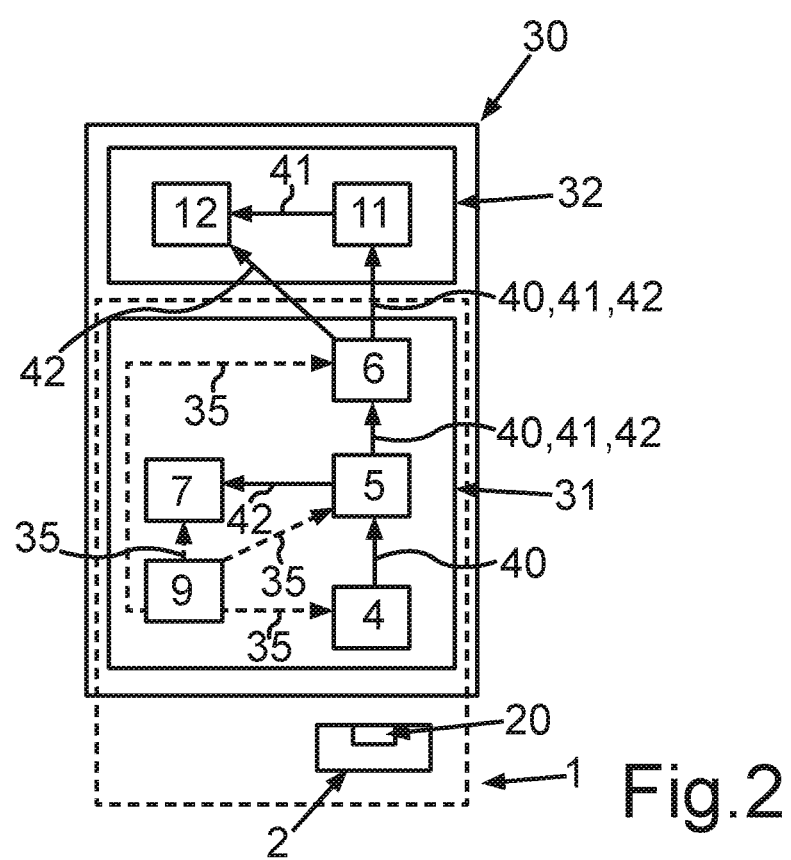
FIG. 2 a schematic illustration of the components of a warning system for carrying out the warning method for the high-voltage battery of the motor vehicle in the case of the accident of the motor vehicle.

Drawn schematically in FIG. 2 are the components of the warning system 30 as well as the transmission of data and electrical energy between individual components of the warning system 30. First of all, with the sensor unit 4, sensor data 40 of a component 20 of the high-voltage battery 2 are determined. The sensor unit 4 can be arranged in proximity to the high-voltage battery 2 or integrated in it. The sensor data 40 may involve, for example, temperature data, voltage values, the state of charge of the high-voltage battery 2, or data that enable a recognition of a short circuit inside the high-voltage battery 2. These data are transmitted to the analysis unit 5 and are analyzed by it. Two possible sets of diagnostic data are thereby differentiated, the transmission of which is illustrated by way of arrows. On the one hand, a state diagnosis 41 of the corresponding component 20 of the high-voltage battery 2 is determined, and, on the other hand, the total state diagnosis 42 of the high-voltage battery 2 is determined. For the determination of the total state diagnosis 42 of the high-voltage battery 2, all individual state diagnoses 41 of the component 20 are taken into consideration. In addition, it is provided that sensor data 40 of a plurality of components 20 of the high-voltage battery 2 are acquired and are available to the analysis unit 5.

The total state diagnosis itself distinguishes between the states "dangerous" and "not dangerous." This total state diagnosis 42 is transmitted to the signal device 7 in the motor vehicle 1. The signal device 7 is, for example, an LED lamp in the region of the window 8 of the motor vehicle 1. If the total state diagnosis 42 of the high-voltage battery 2 is "dangerous," then the signal device 7 is illuminated red. If no danger ensues from the high-voltage battery 2 of the motor vehicle 1, it is provided that the signal device 7 is illuminated green and accordingly signals to emergency responders on site that no danger ensues from the high-voltage battery 2. Alternatively, the signal device 7 may involve a speaker for emission of a signal sound.

Simultaneously to the transmission of the total state diagnosis 42 to the signal device 7, the total state diagnosis 42 is transmitted by use of an eCall connection to the emergency call dispatcher 12 via the communications unit 6. Accordingly, in addition to the data generally transmitted via an eCall connection, such as data in regard to the position of the motor vehicle, data on the total state of the high-voltage battery 2 of the motor vehicle 1 are transmitted to the emergency call dispatcher 12. Because the total state diagnosis 42 includes whether the high-voltage battery 2 is potentially dangerous or not dangerous, the corresponding emergency responders can already be notified, prior to their arrival at the accident site, whether they will be confronted with a dangerous high-voltage battery 2 of the motor vehicle 1.

In addition, the communication link 10 to the vehicle-external monitoring unit 11 is built up via the communications unit 6. The vehicle-external monitoring unit 11 can be, for example, a server in a data-processing center that can be accessed worldwide and is operated either by the vehicle manufacturer itself or run by an authorized operator. Transmitted to this vehicle-external monitoring unit 11 are both the state diagnoses 41 of the individual components 20 of the high-voltage battery 2 and the total state diagnosis 42 of the high-voltage battery 2 as well as the sensor data 40, that is, the raw data measured by the sensor unit 4. The state diagnoses 41 contain data on whether the corresponding component 20 of the high-voltage battery 2 is "OK" or "not OK," that is, whether, on the basis of the corresponding sensor data, it has been possible to establish that these data are not within a predetermined desired range. Through the combination of these state diagnoses 41 with the raw data, that is, with the sensor data 40 as well as with the total state diagnosis 42, the external monitoring unit 11 has available to it all data on the basis of which an estimation as well as a strategy for rendering safe the high-voltage battery 2 of the motor vehicle 1 can be created.

A detailed analysis for possible instructions to emergency responders on site is determined in the vehicle-external monitoring unit 11 either automatically on the basis of corresponding software or by experts. In addition, in the case of a request to the monitoring unit 11 by emergency responders, these experts can provide the emergency responders on site with a strategy to secure the motor vehicle 1 as safely as possible after an accident.

The state diagnoses 41 as well as appropriate supporting assistance by corresponding experts of the monitoring unit 11 can be made available, in addition, to the emergency call dispatcher 12. For this data transfer, there is present a communication link 10 between the emergency call dispatcher 12 and the vehicle-external monitoring unit 11, via which comprehensive data relating to the state of the high-voltage battery 1 of the motor vehicle 1 can be transmitted from the monitoring unit 11 to the emergency call dispatcher 12 and from the latter to corresponding emergency responders.

It is thereby provided that the emergency call dispatcher 12 either automatically retrieves all state diagnoses 41 from the monitoring unit 11 or else actuates this retrieval in accordance with specific algorithms. For example, it would be possible for the emergency call dispatcher 12 to retrieve the corresponding additional state diagnosis data 41 from the monitoring unit 11 only in the case of a danger due to the high-voltage battery 2 of the motor vehicle 1, that is, when the total state diagnosis 42 is "dangerous." Alternatively, the emergency responders on site can decide whether they desire to retrieve additional data about the state of the high-voltage battery 2 of the motor vehicle 1 from the monitoring unit 11. Through this manually triggered retrieval of the state diagnoses 41, it is possible, in addition, to be able to respond to changes in the state of the high-voltage battery 2 of the motor vehicle 1 over the course of time, that is, during the rescue actions. Of course, when there is a change in the state of the high-voltage battery 2 of the motor vehicle 1 on site, it is also possible for a retrieval of the further state diagnoses 41 to be implemented by an automatic request of the emergency call dispatcher 12 at the monitoring unit 11.

The warning system 30 itself is composed of both vehicle-internal parts 31 and vehicle-external parts 32. Internal to the vehicle, 31, the warning system 30 comprises at least the sensor unit 4, the analysis unit 5, the communications unit 6, the signal device 7, and the power supply 9. External to the vehicle, 32, the warning system 30 comprises the vehicle-external monitoring unit 11 as well as the emergency call dispatcher 12. Both the vehicle-internal parts 31 and the high-voltage battery 2 with the component 20 are located inside the motor vehicle 1. The power supply 9 supplies the sensor unit 4, the analysis unit 5, the communications unit 6, and the signal device 7 with electrical energy and this energy transport 35 is depicted schematically by way of dashed arrows in FIG. 2.

Overall, the example shows that, in the case of an accident of the motor vehicle 1 that has the high-voltage battery 2—for example, resulting from its collision with the tree 3—it is possible by use of the warning system 30 to activate a warning method. This method is based on the fact that a total state diagnosis 42 as well as individual state diagnoses 41 of the individual components 20 of the high-voltage battery 2 are determined by the analysis unit 5 on the basis of sensor data 40 of the sensor unit 4 and these data are made available via a communications unit 6 both to a vehicle-external monitoring unit 11 and to an emergency call dispatcher 12.

The invention claimed is:

1. A warning method for a high-voltage battery of a motor vehicle in the case of an accident of the motor vehicle, comprising:
    creation of at least one state diagnosis relating to at least one component of the high-voltage battery on the basis of supplied sensor data by an analysis unit as soon as an accident of the motor vehicle has been detected;
    creation of a total state diagnosis of the high-voltage battery on the basis of the at least one state diagnosis, which is dangerous or not dangerous,
    transmission of the at least one state diagnosis to a vehicle-external monitoring unit via a communications unit, and
    transmission of the total state diagnosis of the high-voltage battery to an emergency call dispatcher via the communications unit,
    wherein the at least one state diagnosis indicates whether the at least one component of the high-voltage battery is defective or is not defective, wherein the sensor data are determined by at least one corresponding sensor device of the motor vehicle and/or of the high-voltage battery and are transmitted to the analysis unit, wherein a power supply supplies the sensor unit, the analysis unit and the communications unit with electrical energy, and the power supply is independent of the high-voltage battery, wherein the analysis unit analyzes each individual component of the high voltage battery to create the at least one state diagnosis, and the total state diagnosis of the high-voltage battery is created based on the at least one state diagnosis, and wherein an assessment of a danger potential is provided with the at least one state diagnosis, the assessment of the danger potential is provided with multi-step scale.

2. The method according to claim 1, wherein the vehicle-external monitoring unit makes available the at least one state diagnosis to the emergency call dispatcher.

3. The method according to claim 1, wherein the total state diagnosis is transmitted to an optical and/or acoustic signal unit of the motor vehicle and is displayed by this unit.

4. The method according to claim 1, wherein the sensor data and the total state diagnosis are transmitted to the vehicle-external monitoring unit.

5. A warning system for carrying out a warning method for a high-voltage battery of a motor vehicle in the case of an accident of the motor vehicle, comprising:

creation of at least one state diagnosis relating to at least one component of the high-voltage battery on the basis of supplied sensor data by an analysis unit as soon as an accident of the motor vehicle has been detected;

creation of a total state diagnosis of the high-voltage battery on the basis of the at least one state diagnosis, which is dangerous or not dangerous, transmission of the at least one state diagnosis to a vehicle-external monitoring unit via a communications unit, and transmission of the total state diagnosis of the high-voltage battery to an emergency call dispatcher via the communications unit, wherein the at least one state diagnosis indicates whether the at least one component of the high-voltage battery is defective or is not defective, wherein the sensor data are determined by at least one corresponding sensor device of the motor vehicle and/or of the high-voltage battery and are transmitted to the analysis unit, wherein a power supply supplies the sensor unit, the analysis unit and the communications unit with electrical energy, and the power supply is independent of the high-voltage battery, wherein the analysis unit analyzes each individual component of the high voltage battery to create the at least one state diagnosis, and the total state diagnosis of the high-voltage battery is created based on the at least one state diagnosis, and wherein an assessment of a danger potential is provided with the at least one state diagnosis, the assessment of the danger potential is provided with multi-step scale.

6. The warning system according to claim 5, wherein vehicle-external components of the warning system are designed to be supplied with electrical energy by an energy supply source that is independent of the high-voltage battery.

7. The warning system according to claim 5, wherein the warning system itself has the power supply, which is designed to supply vehicle-external components of the warning system with electrical energy independently of the high-voltage battery.

8. A motor vehicle, comprising:
an analysis unit, which is equipped
  i. to create, on the basis of supplied sensor data, at least one state diagnosis relating to at least one component of the high-voltage battery as soon as an accident of the motor vehicle has been detected,
  ii. to create a total state diagnosis of the high-voltage battery on the basis of the at least one state diagnosis, which is dangerous or not dangerous,
a communications unit, which is equipped to transmit the at least one state diagnosis to a vehicle-external monitoring unit and the total state diagnosis of the high-voltage battery to an emergency call dispatcher, wherein the at least one state diagnosis indicates whether the at least one component of the high-voltage battery is defective or is not defective, wherein the sensor data are determined by at least one corresponding sensor device of the motor vehicle and/or of the high-voltage battery and are transmitted to the analysis unit, wherein a power supply supplies the sensor unit, the analysis unit and the communications unit with electrical energy, and the power supply is independent of the high-voltage battery, wherein the analysis unit analyzes each individual components of the high voltage battery to create the at least one state diagnosis, and the total state diagnosis of the high-voltage battery is created based on the at least one state diagnosis, and wherein an assessment of a danger potential is provided with the at least one state diagnosis, the assessment of the danger potential is provided with multi-step scale.

* * * * *